United States Patent
Sato

(10) Patent No.: US 10,622,033 B2
(45) Date of Patent: Apr. 14, 2020

(54) SEMICONDUCTOR STORAGE DEVICE

(71) Applicant: TOSHIBA MEMORY CORPORATION, Minato-ku, Tokyo (JP)

(72) Inventor: Jumpei Sato, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 62 days.

(21) Appl. No.: 15/895,697

(22) Filed: Feb. 13, 2018

(65) Prior Publication Data
US 2018/0268877 A1 Sep. 20, 2018

Related U.S. Application Data

(60) Provisional application No. 62/471,713, filed on Mar. 15, 2017.

(51) Int. Cl.
| | |
|---|---|
| G11C 7/00 | (2006.01) |
| G11C 7/06 | (2006.01) |
| G11C 11/4094 | (2006.01) |
| G11C 11/408 | (2006.01) |
| G11C 16/08 | (2006.01) |
| G11C 16/26 | (2006.01) |
| G11C 16/04 | (2006.01) |

(52) U.S. Cl.
CPC ............... *G11C 7/06* (2013.01); *G11C 7/067* (2013.01); *G11C 11/4087* (2013.01); *G11C 11/4094* (2013.01); *G11C 16/08* (2013.01); *G11C 16/26* (2013.01); *G11C 16/0483* (2013.01); *G11C 2207/002* (2013.01); *G11C 2207/063* (2013.01)

(58) Field of Classification Search
CPC .. G11C 11/4091; G11C 16/26; G11C 11/4087
USPC .................................................... 365/189.011
See application file for complete search history.

(56) References Cited

U.S. PATENT DOCUMENTS

| | | |
|---|---|---|
| 2002/0036317 A1 | 3/2002 | Matsui et al. |
| 2009/0267128 A1 | 10/2009 | Maejima |
| 2009/0268522 A1* | 10/2009 | Maejima ................. G11C 5/02 365/185.11 |
| 2009/0316494 A1 | 12/2009 | Uehara et al. |
| 2010/0034023 A1 | 2/2010 | Shingu et al. |
| 2011/0038194 A1* | 2/2011 | Murata ................. G11C 5/063 365/63 |
| 2011/0284946 A1 | 11/2011 | Kiyotoshi |
| 2012/0201083 A1 | 8/2012 | Fujiu |

(Continued)

FOREIGN PATENT DOCUMENTS

JP      2016046269 A      4/2016

*Primary Examiner* — Hoai V Ho
*Assistant Examiner* — Minh Dinh
(74) *Attorney, Agent, or Firm* — Holtz, Holtz & Volek PC

(57) ABSTRACT

According to one embodiment, a semiconductor storage device includes: a memory cell array including a plurality of bit lines; a sense amplifier; a first circuit including a plurality of transistors respectively connected to the plurality of bit lines and the sense amplifier; and a plurality of interconnects which are provided at a position higher than the bit lines in the first circuit and are not directly connected to the first circuit. The semiconductor storage device does not include, at a position higher than the plurality of interconnects, an interconnect which electrically connects two positions in the semiconductor storage device.

13 Claims, 12 Drawing Sheets

(56) References Cited

U.S. PATENT DOCUMENTS

| | | |
|---|---|---|
| 2013/0141971 A1 | 6/2013 | Hosono |
| 2014/0016391 A1* | 1/2014 | Tanaka .................... G11C 8/08 365/72 |
| 2014/0085979 A1 | 3/2014 | Kono |
| 2015/0302929 A1 | 10/2015 | Maejima |
| 2016/0056067 A1 | 2/2016 | Endo et al. |
| 2016/0267981 A1* | 9/2016 | Hioka ................ G11C 16/0483 |

* cited by examiner

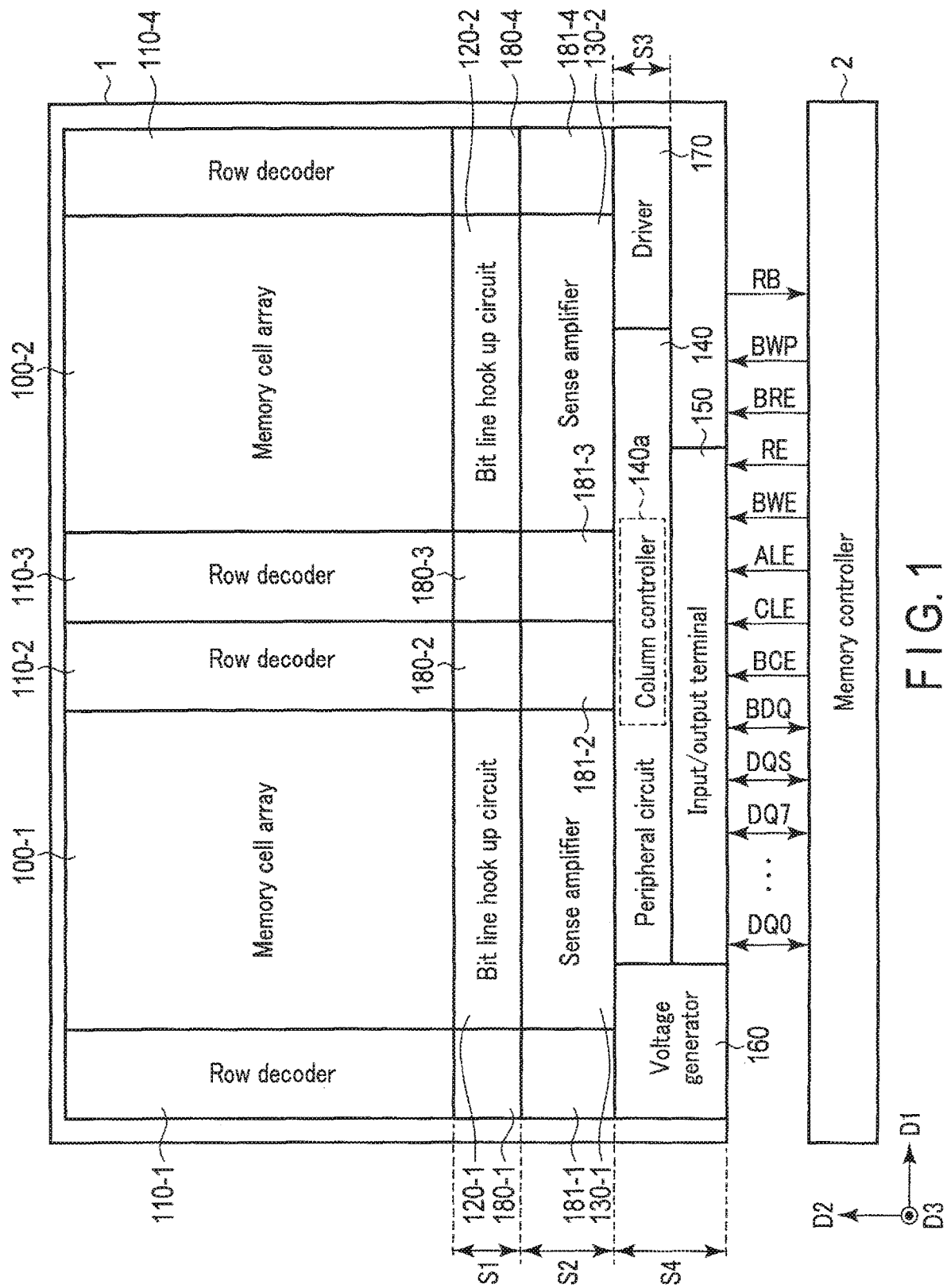
F I G. 1

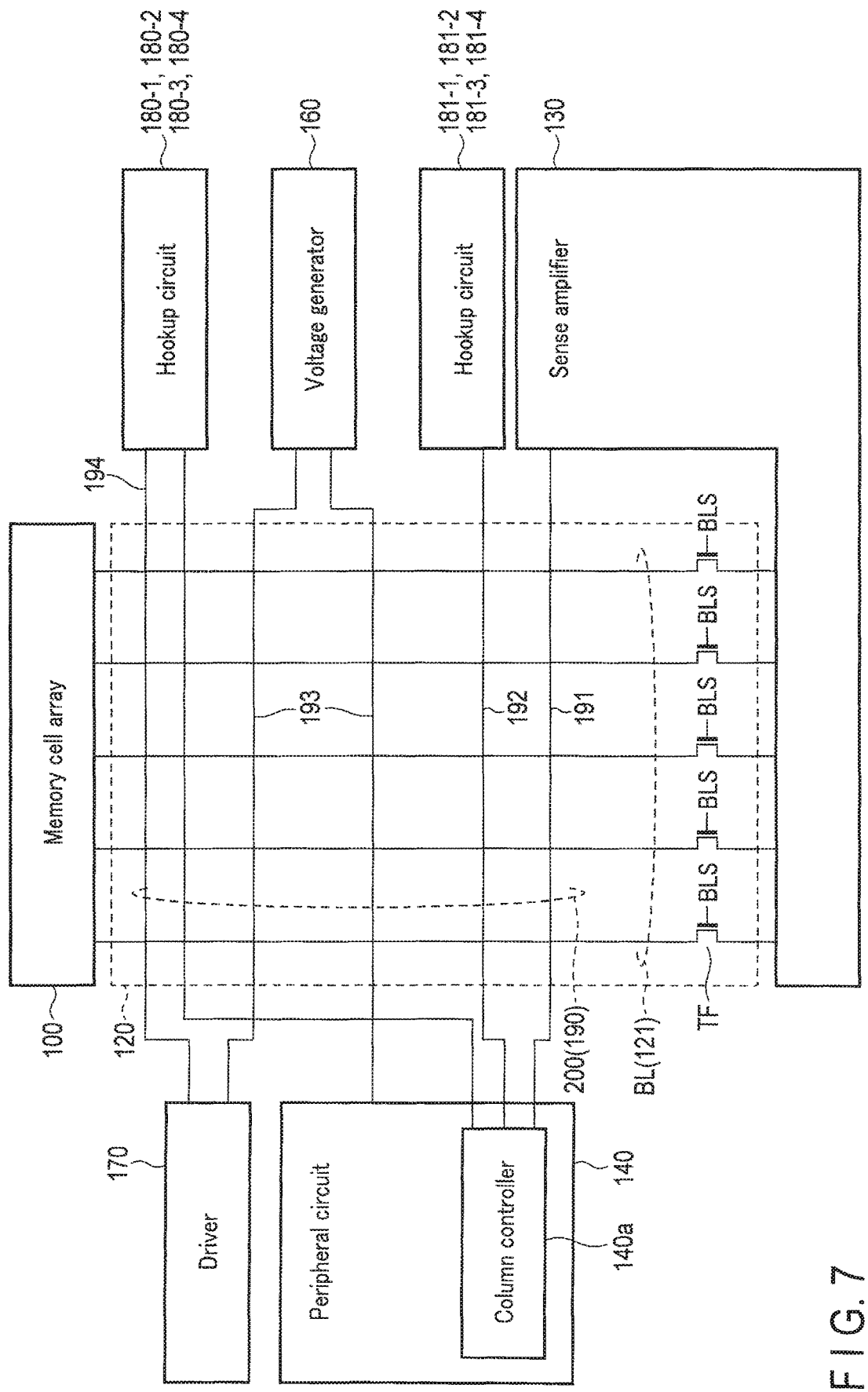
F I G. 7

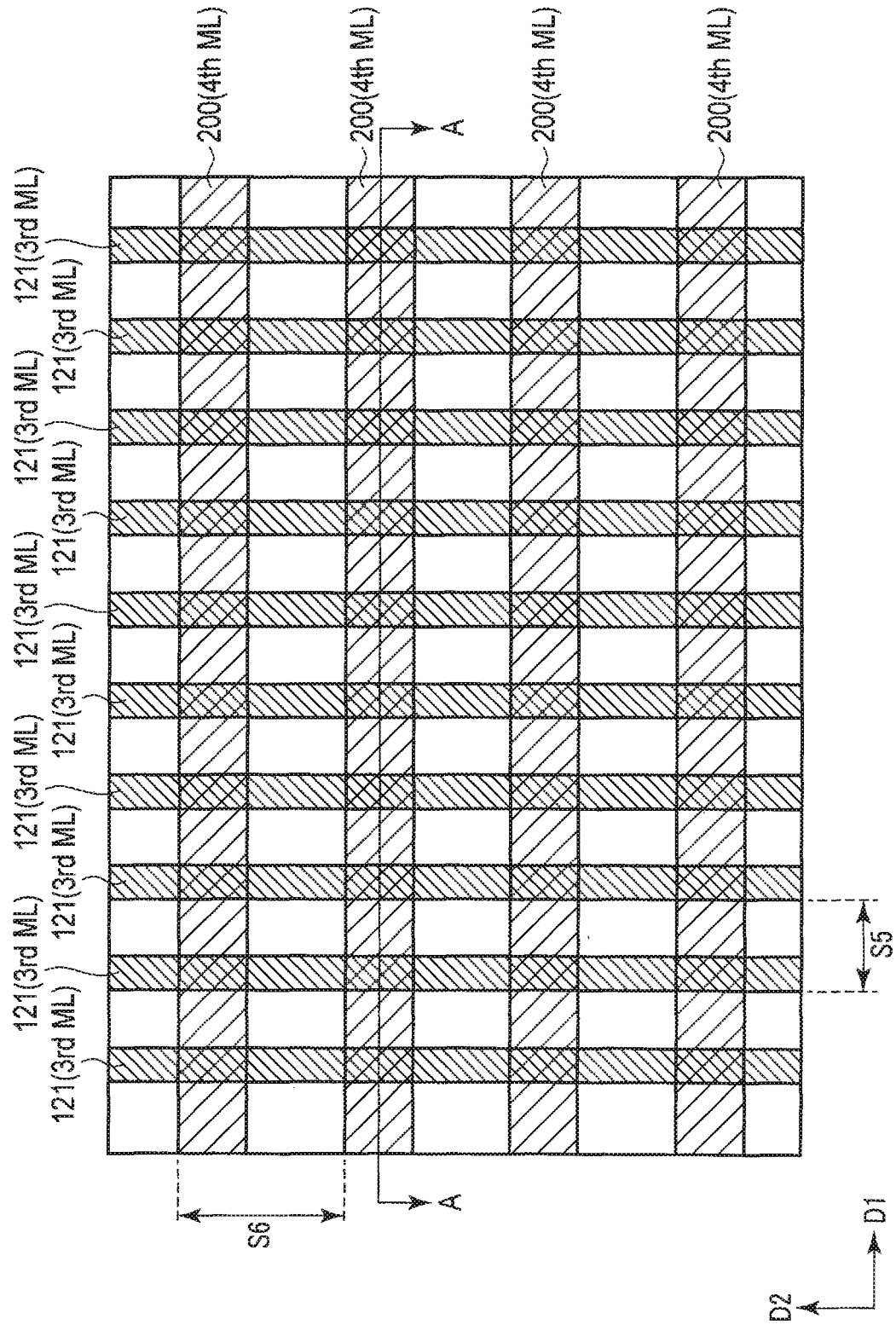
F I G. 8

SEMICONDUCTOR STORAGE DEVICE

CROSS-REFERENCE TO RELATED APPLICATIONS

This application claims the benefit of U.S. Provisional Application No. 62/471,713, filed Mar. 15, 2017, the entire contents of which are incorporated herein by reference.

FIELD

Embodiments described herein relate generally to a semiconductor storage device.

BACKGROUND

Miniaturization of semiconductor storage devices has been advancing.

BRIEF DESCRIPTION OF THE DRAWINGS

FIG. 1 is a view illustrating a semiconductor storage device according to an embodiment and a memory system including the semiconductor storage device.

FIG. 7 is a view which schematically illustrates a relationship between some interconnects of and interconnects of the bit line hookup circuit of the semiconductor storage device according to the embodiment the semiconductor storage device according to the embodiment.

FIG. 8 is a plan view illustrating a relationship between some interconnects in the bit line hookup circuit of the semiconductor storage device according to the embodiment.

DETAILED DESCRIPTION

Figure 2:
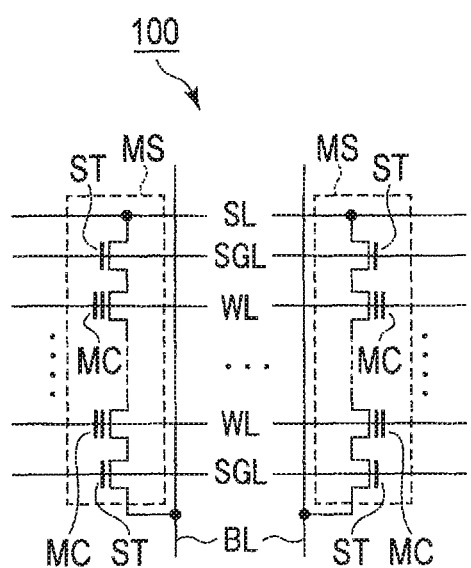
FIG. 2 is a view illustrating a memory cell array according to the embodiment.

In general, according to one embodiment, a semiconductor storage device includes: a memory cell array including a plurality of bit lines; a sense amplifier; a first circuit including a plurality of transistors respectively connected to the plurality of bit lines and the sense amplifier; and a plurality of interconnects which are provided at a position higher than the bit lines in the first circuit and are not directly connected to the first circuit. The semiconductor rage device does not include, at a position higher than the plurality of interconnects, an interconnect which electrically connects two positions in the semiconductor storage device.

Hereinafter, embodiments, which have been constructed, will be described with reference to the accompanying drawings. In the description below, structural elements having substantially the same functions and structures are denoted by like signs. A suffix number "-X (X is an arbitrary numeral)" after a numeral, which constitutes a reference sign, is used in order to distinguish elements which are referred to by reference signs including the same numeral and have the same structure. When it is not necessary to distinguish elements which are indicated by reference signs including the same numeral, these elements are referred to by a reference sign including only the numeral. For example, when it is not necessary to distinguish elements with reference signs 100-1 and 100-2, these elements are comprehensively referred to by a reference sign 100.

It should be noted that the drawings are schematic ones, and the relationship between a thickness and a planar dimension, the ratio in thickness between layers, etc. are different from real ones. Thus, concrete thicknesses and dimensions should be judged in consideration of descriptions below. In addition, needless to say, the drawings include parts with mutually different relations or ratios of dimensions.

Hereinafter, in the present specification, an XYZ orthogonal coordinate system is introduced for the purpose of convenience in descriptions. In this coordinate system, two directions, which are parallel to a top surface of a semiconductor substrate 10 (to be described later) and are perpendicular to each other, are defined as a D1(X) direction and a D2(Y) direction, and a direction, which is perpendicular to both the D1 direction and D2 direction, that is, a direction of stacking of layers, is defined as a D3 (Z) direction. In the description below, the expression "height" means a length in the D3 direction.

<1> Embodiment

A semiconductor storage device according to an embodiment will be described. Hereinafter, a description is given of an example in which a planar NAND-type flash memory is applied as the semiconductor storage device.

<1-0> Configuration of Memory System

To begin with, the configuration of a memory system including the semiconductor storage device according to the present embodiment will be described with reference to FIG. 1. FIG. 1 illustrates the memory system including the semiconductor storage device according to the embodiment, and illustrates, in particular, some components of the storage device and a layout thereof.

As illustrated in FIG. 1, the memory system includes a NAND-type flash memory 1 and a memory controller 2. For example, the memory controller 2 and NAND-type flash memory 1 may be combined to constitute a single semiconductor device, for instance, a memory card such as an SD™ card, or an SSD (solid state drive). In addition, the memory system may be configured to further include a host (not shown).

The NAND-type flash memory 1 includes a plurality of memory cells, and stores data nonvolatilely. The memory controller 2 is connected to the NAND-type flash memory 1 by a NAND bus, and is connected to a host by a host bus. In addition, the memory controller 2 controls the NAND-type flash memory 1, and accesses the NAND-type flash memory 1 in response to an instruction received from the host. The host is, for example, a digital camera or a personal computer, and the host bus is a bus according to, for example, an SD interface.

The NAND bus transmits/receives signals according to a NAND interface. Concrete examples of the signals are a chip enable signal BCE, a command latch enable signal CLE, an address latch enable signal ALE, a write enable signal BWE, a read enable signal RE, BRE, a write protect signal BWP, a data strobe signal DQS, BDQS, a ready/busy signal RB, and input/output signals DQ (DQ0 to DQ7). The data strobe signal BDQS is a complementary signal of the data strobe signal DQS.

<1-1> Entire Configuration of the NAND-Type Flash Memory

Figure 3:
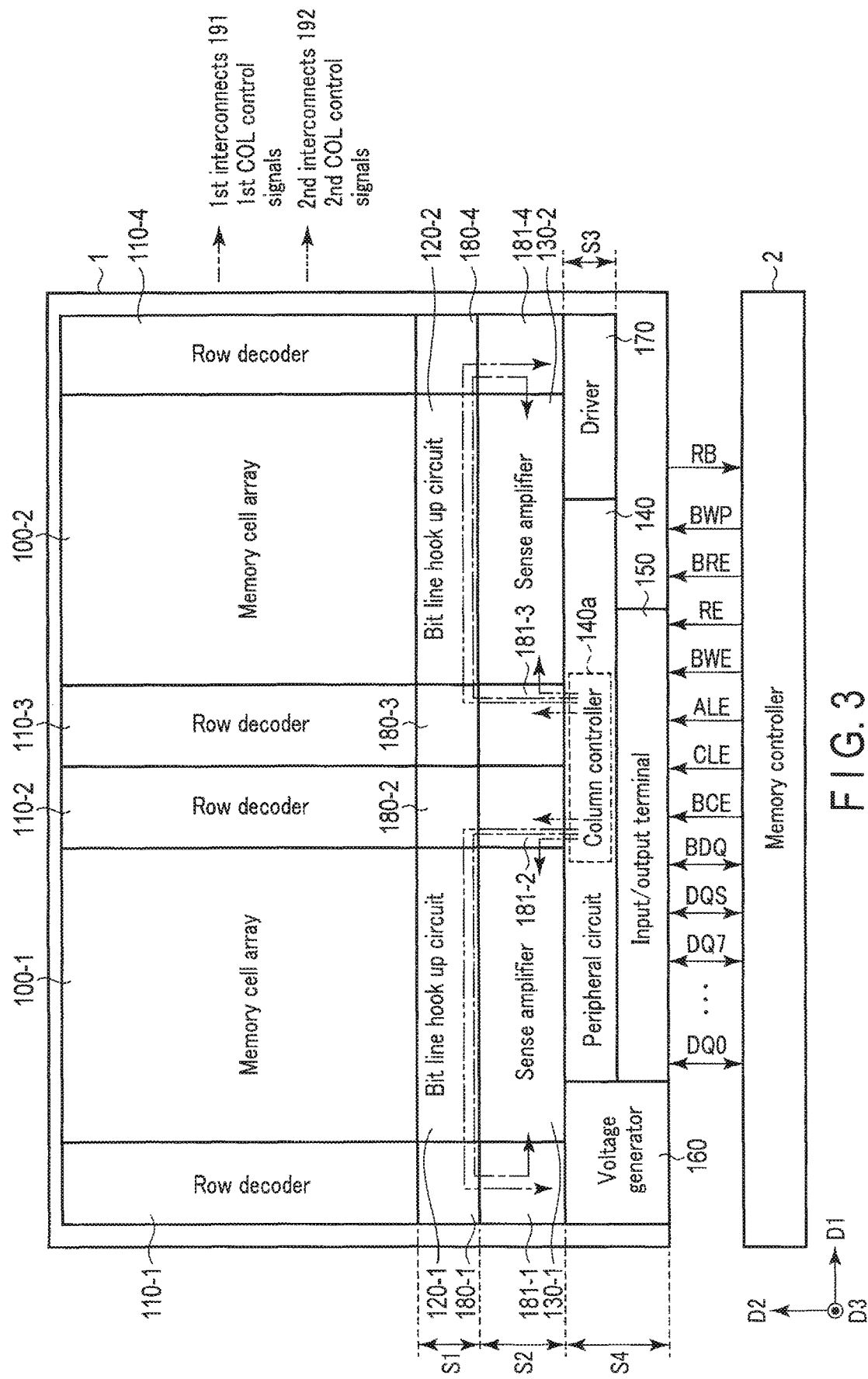
FIGS. 3 to 5 are views illustrating the semiconductor storage device and associated interconnects according to the embodiment.
Figure 4:
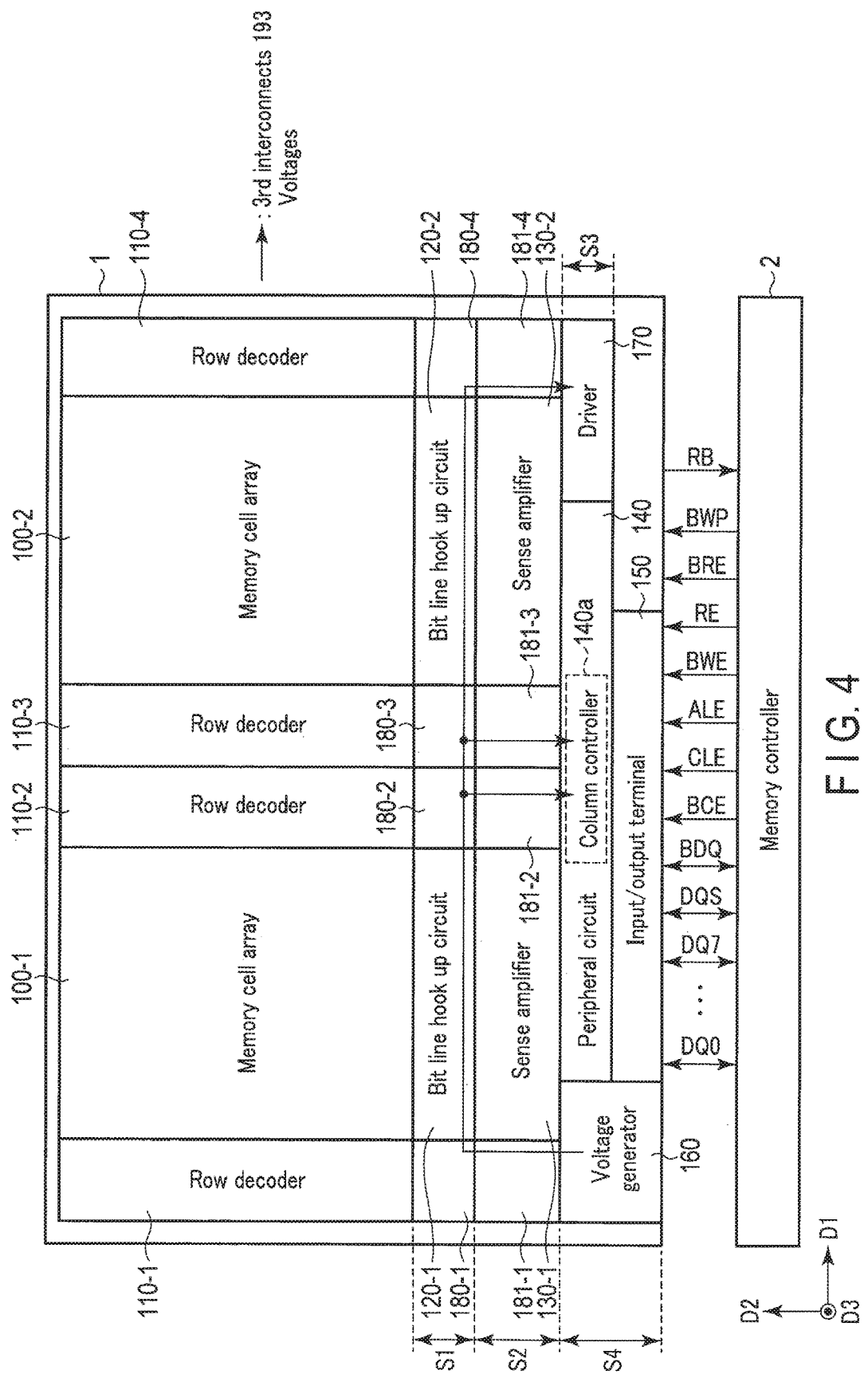
Figure 5:
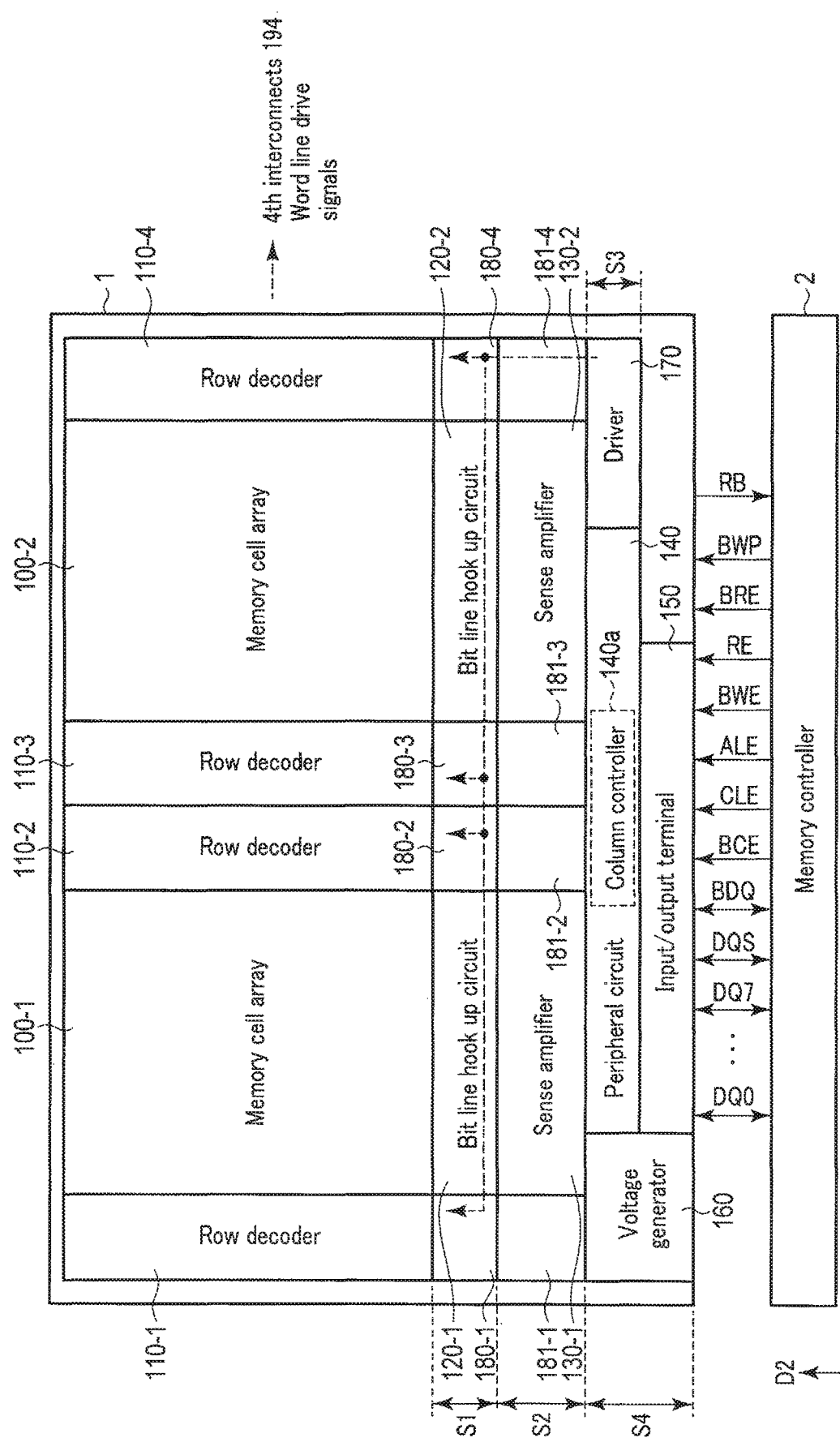

Referring to FIG. 1 to FIG. 5, the configuration of the NAND-type flash memory (semiconductor storage device) 1 according to the embodiment will be schematically described. FIG. 2 is a view illustrating a memory cell array according to the embodiment. FIG. 3 is a view illustrating first and second interconnects in addition to the memory system of FIG. 1. FIG. 4 is a view illustrating third interconnects in addition to the memory system of FIG. 1. FIG. 5 is a view illustrating fourth interconnects in addition to the memory system of FIG. 1. FIGS. 3 to 5 illustrate the same configuration, excluding the first to fourth interconnects. In the description below, an example will be described in which the NAND-type flash memory 1 has two planes. However, this embodiment is also applicable to a NAND-type flash memory 1 including more than two planes.

FIG. 1 also illustrates an example of a layout extending in the D1 and D2 directions of the NAND-type flash memory 1 according to the embodiment. As illustrated in FIG. 1, the NAND-type flash memory 1 includes, on a semiconductor substrate, memory cell arrays 100-1 and 100-2, row decoders 110-1, 110-2, 110-3 and 110-4, bit line hookup circuits 120-1 and 120-2, sense amplifiers 130-1 and 130-2, a peripheral circuit 140, an input/output terminal 150, a voltage generator (pump circuit) 160, a driver 170, hookup regions 180-1, 180-2, 180-3 and 180-4, and hookup regions 181-1, 181-2, 181-3 and 181-4.

A first plane includes the memory cell array 100-1, row decoders 110-1 and 110-2, bit line hookup circuit 120-1, sense amplifier 130-1, hookup regions 180-1 and 180-2, and hookup regions 181-1 and 181-2. A second plane includes the memory cell array 100-2, row decoders 110-3 and 110-4, bit line hookup circuit 120-2, sense amplifier 130-2, hookup regions 180-3 and 180-4, and hookup regions 181-3 and 181-4. The peripheral circuit 140, input/output terminal 150, voltage generator 160 and driver 170 are shared by the plural planes.

The input/output terminal 150 extends along one side (a side along the D1 direction) of the NAND-type flash memory 1, and is provided in an end region of the NAND-type flash memory 1. The memory controller 2 and NAND-type flash memory 1 are connected via the input/output terminal 150.

The input/output terminal 150 transmits the data strobe signals DQS and BDQS, input/output signals DQ and ready/busy signal RB to the memory controller 2 via pads (not shown).

The input/output terminal 150 generates the data strobe signals DQS and BDQS in accordance with a signal supplied from the peripheral circuit 140. The input/output terminal 150 outputs the data strobe signals DQS and BDQS when outputting the data input/output signals DQ. In addition, at a timing of the data strobe signals DQS and BDQS, the memory controller 2 receives the data input/output signals DQ.

The input/output signals DQ form, for example, a 8-bit signal. The input/output signals DQ are a substance of data which is transmitted/received between the NAND-type flash memory 1 and memory controller 2, and are a command, address information, write data, read data, etc.

The ready/busy signal RB is a signal which indicates whether the NAND-type flash memory 1 is in a ready state (a state in which the NAND-type flash memory 1 can receive an instruction from the memory controller 2) or a busy state (a state in which the NAND-type flash memory 1 cannot receive an instruction from the memory controller 2).

In addition, the input/output terminal 150 receives from the memory controller 2, via pads (not shown), the chip enable signal BCE, command latch enable signal CLE, address latch enable signal ALE, write enable signal BWE, read enable signal RE, BRE, write protect signal BWP, and data strobe signal DQS, BDQS.

The chip enable signal BCE is used as a select signal of the NAND-type flash memory 1.

The command latch enable signal CLE is a signal which is used when a command is taken in the peripheral circuit 140.

The address latch enable signal ALE is a signal which is used when address information or input data is taken in the peripheral circuit 140.

The write enable signal BWE is a signal for taking in the NAND-type flash memory 1 the command, address and data on the input/output terminal 150.

The read enable signal RE is a signal which is used when data is serially output from the input/output terminal 150. The read enable signal BRE is a complementary signal of RE.

The write protect signal IMP is used in order to protect data from unexpectable erase or write, when an input signal is uncertain, such as when the NAND-type flash memory 1 is powered on or powered off.

Although not illustrated in FIG. 1, Vcc/Vss/Vccq/Vssq pads, etc. for power supply are also provided in the input/output terminal 150.

Figure 9:
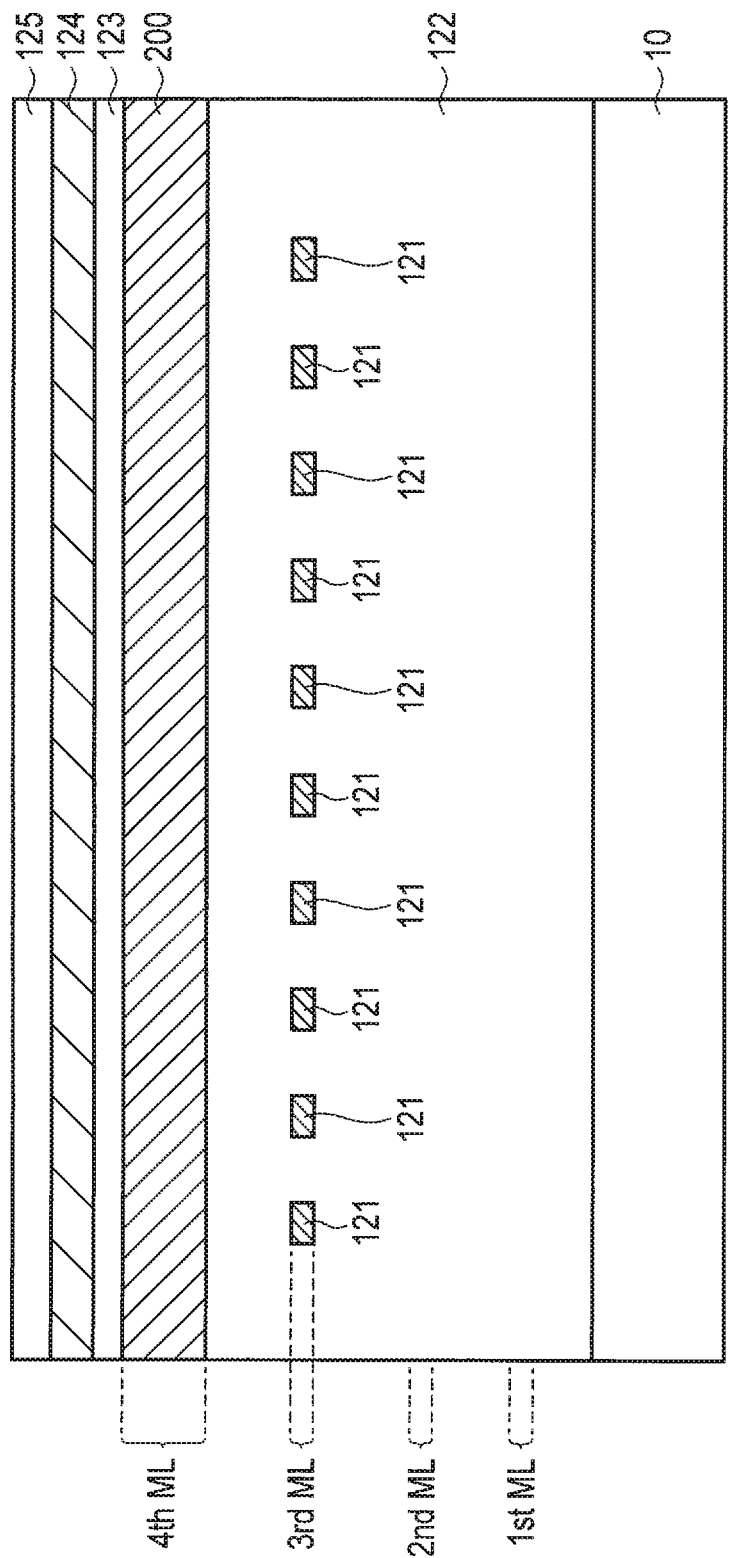
FIG. 9 is a cross-sectional view illustrating some interconnects in the bit line hookup circuit of the semiconductor storage device according to the embodiment.

As illustrated in FIG. 9, the input/output terminal also includes first to fourth metal layers (1st Mt to 4th ML). The first metal layer is located at a position higher than a position where, for instance, control gates of transistors on the semiconductor substrate 10 is provided. The second metal layer is a layer which is located at a position higher than the first metal layer, and in which interconnects or the like that are connected to the first metal layer via contact plugs or the like are provided. The third metal layer is a layer which is located higher than the second metal layer, and in which a bit line or the like is provided. The fourth metal layer is an interconnect layer which is located higher than the third metal layer, and is located at the highest position among the interconnect layers of the NAND flash memory 1. In addition, interconnects located in the fourth metal layer are thicker than interconnects located in the first to third metal layers, and have a lower resistance than the interconnects located in the first to third metal layers.

As illustrated in FIG. 2, the memory cell array 100 (100-1, 100-2) includes a plurality of memory strings MS. Each memory string MS includes a select transistor ST, a plurality of memory cell transistors (also referred to simply as memory cells or the like) MC, and a select transistor ST, which are connected in series. One of the select transistors ST is connected to a source line SL, and the other select transistor ST is connected to a bit line BL. Specifically, each memory string MS is connected to the bit line BL, a plurality of word lines WL, and the source line SL.

Each memory cell transistor MC stores data nonvolatilely, and the data is electrically rewritable. The memory cell transistors MC are arranged, for example, three-dimensionally. The memory cell transistor MC includes, for example, a stacked gate including a control gate electrode and a charge storage layer (e.g. a floating gate electrode), and stores single-level data or multilevel data in accordance with a variation of a threshold of the transistor, which is determined by a charge amount injected in the floating gate electrode. In addition, the memory cell transistor MC may have a MONOS (Metal-Oxide-Nitride-Oxide-Silicon) structure in which electrons are trapped in a nitride film.

A dummy memory cell transistor may be included between a select transistor ST and a memory cell transistor MC. Besides, a select transistor ST or a dummy memory cell transistor may be additionally provided between the plural memory cell transistors MC.

The source line SL and bit line BL may be provided for each of the memory strings MS, or may be shared by the memory strings MS.

The configuration of the memory cell array 100 is disclosed in U.S. patent application Ser. No. 12/397,711 filed Mar. 3, 2009 and entitled "SEMICONDUCTOR MEMORY DEVICE HAVING PLURALITY OF TYPES OF MEMORIES INTEGRATED ON ONE CHIP". In addition, the configuration thereof is disclosed in U.S. patent application Ser. No. 13/451,185 filed Apr. 19, 2012 and entitled "SEMICONDUCTOR MEMORY DEVICE INCLUDING STACKED GATE HAVING CHARGE ACCUMULATION LAYER AND CONTROL GATE AND METHOD OF WRITING DATA TO SEMICONDUCTOR MEMORY DEVICE", in U.S. patent application Ser. No. 12/405,626 filed Mar. 17, 2009 and entitled "NONVOLATILE SEMICONDUCTOR MEMORY ELEMENT, NONVOLATILE SEMICONDUCTOR MEMORY, AND METHOD FOR OPERATING NONVOLATILE SEMICONDUCTOR MEMORY ELEMENT", and in U.S. patent application Ser. No. 09/956,986 filed Sep. 21, 2001 and entitled "NONVOLATILE SEMICONDUCTOR MEMORY DEVICE HAVING ELEMENT ISOLATING REGION OF TRENCH TYPE AND METHOD OF MANUFACTURING THE SAME". The entire descriptions of these patent applications are incorporated by reference herein.

Referring back to FIG. 1, the row decoders 110-1 and 110-2 extend in the D2 direction, and sandwich the memory cell array 100-1 in the D1 direction. The row decoders 110-1 an 110-2 select a block BLK of the memory cell array 100-1 at a time of a read operation, a write operation or an erase operation of data. The row decoders 110-1 and 110-2 transfer a voltage, which is necessary in the read operation, write operation or erase operation, to the word line WL and a select gate line SGL of the memory cell array 100-1.

The row decoders 110-3 and 110-4 extend in the D2 direction, and sandwich the memory cell array 100-2 in the D1 direction. Like the row decoders 110-1 and 110-2, the row decoders 110-3 and 110-4 select a block BLK of the memory cell array 100-2 at a time of a read operation, a write operation or an erase operation of data. The row decoders 110-3 and 110-4 transfer a voltage, which is necessary in the read operation, write operation or erase operation, to the word line WL and a select gate line SGL of the memory cell array 100-2.

The bit line hookup circuit 120-1 is juxtaposed with the memory cell array 100-1 in the D2 direction and is arranged along the memory cell array 100-1. The length in the D2 direction of the bit line hookup circuit 120-1 is S1. In the bit line hookup circuit 120-1, transfer transistors, which transfer signals between the bit lines BL in the memory cell array 100-1 and the sense amplifier 130-1, are disposed. In other words, the bit lines BL in the memory cell array 100-1 are connected to the sense amplifier 130-1 via the transfer transistors. The bit line hookup circuit 120-1 controls a connection between the bit lines BL and sense amplifier 130-1, based on control signals from a column controller 140a.

The bit line hookup circuit 120-2 is juxtaposed with the memory cell array 100-2 in the D2 direction and arranged along the memory cell array 100-2. The length in the D2 direction of the bit line hookup circuit 120-2 is S1. In the bit line hookup circuit 120-2, transfer transistors, which transfer signals between the bit lines BL in the memory cell array 100-2 and the sense amplifier 130-2, are disposed. In other words, the bit lines BL in the memory cell array 100-2 are connected to the sense amplifier 130-2 via the transfer transistors. The bit line hookup circuit 120-2 controls a connection between the bit lines BL and sense amplifier 130-2, based on control signals from the column controller 140a.

The bit line hookup circuits 120-1 and 120-2 also include first to fourth metal layers.

The hookup regions 180-1 and 180-2 sandwich the bit line hookup circuit 120-1 in the D1 direction, receive word line drive signals from the driver 170, and supply the received word line drive signals to the row decoders 110-1 and 110-2. Besides, the hookup regions 180-1 and 180-2 include first to fourth metal layers.

The hookup regions 180-3 and 180-4 sandwich the bit line hookup circuit 120-2 in the D1 direction, receive word line drive signals from the driver 170, and supply the received word line drive signals to the row decoders 110-3 and 110-4. Besides, the hookup regions 180-3 and 180-4 include first to fourth metal layers.

The sense amplifier 130-1 is provided along the bit line hookup circuit 120-1, and the sense amplifier 130-1 and memory cell array 100-1 sandwich the bit line hook up circuit 120-1 in the D2 direction. The length of the sense amplifier 130-1 in the D2 direction is S2. The sense amplifier 130-1 includes sense circuits (not shown) which sense-amplify voltages of the bit lines BL in the memory cell array 100-1, and data storage circuits (not shown) for latching read-out data or data to be written. The sense amplifier 130-1 senses data of the memory cell transistors MC in the memory cell array 100-1 via the bit lines BL. The sense amplifier 130-1 operates, based on first column control signals (1st COL control signals) and second column control signals (2nd COL control signals).

The sense amplifier 130-2 is provided along the bit line hookup circuit 120-2, and the sense amplifier 130-2 and memory cell array 100-2 sandwich the bit line hookup circuit 120-2 in the D2 direction. The length of the sense amplifier 130-2 in the D2 direction is S2. The sense amplifier 130-2 includes sense circuits (not shown) which sense-amplify voltages of the bit lines BL in the memory cell array 100-2, and data storage circuits (not shown) for latching read-out data or data to be written. The sense amplifier 130-2 senses data of the memory cell transistors MC in the memory cell array 100-2 via the bit lines BL. The sense amplifier 130-2 operates, based on first column control signals and second column control signals.

The hookup regions 181-1 and 181-2 sandwich the sense amplifier 130-1 in the D1 direction. The hookup regions 181-3 and 181-4 sandwich the sense amplifier 130-2 in the D1 direction.

The peripheral circuit 140 extends in the D1 direction, and is provided to neighbor the sense amplifiers 130. The peripheral circuit 140 includes, for example, data transfer circuits (not shown), a control circuit (not shown) and a column controller 140a. The length in the D2 direction of the peripheral circuit 140 is S3. The data transfer circuit receives the data of the memory cell transistors MC, which is read out by the sense amplifiers 130 to the data storage circuit, and transfers the received data to the input/output terminal 150.

Then, the data is output from the input/output terminal 150 to the outside (memory controller 2 or host).

The control circuit controls the NAND-type flash memory 1 in accordance with a control signal and a command, which are input via the input/output terminal 150. Specifically, the control circuit controls the memory cell arrays 100, row decoders 110, bit line hookup circuits 120, sense amplifiers 130, input/output buffer, column controller 140*a*, input/output terminal 150, voltage generator 160, and driver 170. Although the control circuit was described as being provided in the peripheral circuit 140, the peripheral circuit 140 itself may be configured as the control circuit.

The column controller 140*a* is provided in the peripheral circuit 140 near lower portions of the hookup regions 181-2 and 181-3 in the D2 direction. The column controller 140*a* generates first and second column control signals. As will be described later with reference to FIG. 3, the first column control signals are supplied to the sense amplifiers 130 via first interconnects 191. The second column control signals are supplied to the sense amplifiers 130 via the hookup regions 181 and second interconnects 192. The details will be described later.

The peripheral circuit also includes first to fourth metal (4th ML) layers.

The voltage generator 160 is provided at a region of an end portion of the NAND-type flash memory 1 and is provided to neighbor the input output terminal 150 and peripheral circuit 140. The length in the D2 direction of the voltage generator 160 is S4. The voltage generator 160 includes, for example, a charge pump, and increases a power supply voltage as needed, based on an instruction from the control circuit. The voltage generator 160 supplies the increased voltages (pump outputs) to the components in the NAND-type flash memory 1. For example, as will be described later with reference to FIG. 4, the voltage generator 160 supplies voltages to the peripheral circuit 140 and driver 170 via third interconnects 193. The voltage generator 160 also includes first to fourth metal layers.

When the driver 170 is supplied with the voltages from the voltage generator 160, the driver 170 generates word line drive signals. As will be described later with reference to FIG. 5, the driver 170 supplies the word line drive signals to the hookup regions 180 via fourth interconnects (parts of CG lines and SG lines) 194. The length in the D2 direction of the driver 170 is S3. The CG line is connected to the word line WL via the row decoder 110. The SG line is connected to the select gate line SGL via the row decoder 110. The driver 170 also includes first to fourth metal layers.

Referring to FIGS. 3 to 5, a description will now be given of the transmission of the first and second column control signals from the column controller 140*a*, the increased voltages from the voltage generator 160, and the word line drive signals from the driver 170. FIGS. 3 to FIG. 5 illustrate, in addition to the components of FIG. 1, the paths of the first and second column control signals, increased voltages and word line drive signals. In particular, FIGS. 3 to FIG. 5 illustrate the first to fourth interconnects 191 to 194 among the paths. The first to fourth interconnects 191 to 194 are realized by arbitrary ones of the interconnects located in the first to fourth metal layers and contacts which mutually connect a plurality of interconnects used among the interconnects located in the first to fourth metal layers. The first to fourth interconnects 191 to 194 will be described later in detail.

The first column control signals are classified into at least first to fourth types. One or more first column control signals belonging to an identical type are supplied along similar paths.

As illustrated in FIG. 3, the first column control signals of the first type are supplied to the sense amplifier 130-1 via the first interconnects 191 provided on the hookup regions 181-2 and 180-2, bit line hookup circuit 120-1 and hookup regions 180-1 and 181-1.

The first column control signals of the second type are supplied to the sense amplifier 130-1 via the first interconnects 191 provided on the hookup region 181-2.

The first column control signal of the third types are supplied to the sense amplifier 130-2 via the first interconnects 191 provided on the hookup region 181-3.

The first column control signals of the fourth type are supplied to the sense amplifier 130-2 via the first interconnects 191 provided on the hookup regions 181-3 and 180-3, bit line hookup circuit 120-2 and hookup regions 180-4 and 181-4.

The second column control signals are classified into at least first to fourth types. One or more second column control signals belonging to an identical type are supplied along similar paths.

The second column control signals of the first type are transmitted to the hookup region 181-1 by the second interconnect 192 provided on the hookup regions 181-2 and 180-2, bit line hookup circuit 120-1 and hookup regions 180-1 and 181-1. The hookup region 181-1 receives the second column control signals of the first type, and supplies the received second column control signals of the first type to the sense amplifier 130-1.

The second column control signals of the second type are transmitted to the hookup region 181-2 by the second interconnects 192 provided on the hookup region 181-2. The hookup region 181-2 receives the second column control signals of the second type, and supplies the received second column control signals of the second type to the sense amplifier 130-1.

The second column control signals of the third type are transmitted to the hookup region 181-3 by the second interconnects 192 provided on the hookup region 181-3. The hookup region 181-3 receives the second column control signals of the third type, and supplies the received second column control signals of the third type to the sense amplifier 130-2.

The second column control signals of the fourth type are transmitted to the hookup region 181-4 by the second interconnects 192 provided on the hookup regions 181-3 and 180-3, bit line hookup circuit 120-2 and hookup regions 180-4 and 181-4. The hookup region 181-4 receives the second column control signals of the fourth type, and supplies the received second column control signals of the fourth type to the sense amplifier 130-2.

By such transmission of the first and second column control signals, the sense amplifiers 130 directly or indirectly receive the column control signals from the first interconnects 191 and second interconnects 192.

As illustrated in FIG. 4, some of the voltages from the voltage generator 160 are supplied to the peripheral circuit 140 via the third interconnects 193 provided on the hookup regions 181-1 and 180-1, bit line hookup circuit 120-1 and hookup regions 180-2 and 181-2. Some of the voltage from the voltage generator 160 are supplied to the peripheral circuit 140 via the third interconnects 193 provided on the hookup regions 181-1 and 180-1, bit line hookup circuit 120-1 and hookup regions 180-2, 180-3 and 181-3. Some of the voltages from the voltage generator 160 are supplied to the driver 170 via the third interconnects 193 provided on the hookup regions 181-1 and 180-1, bit line hookup circuit 120-1, hookup regions 180-2 and 180-3, bit line hookup circuit 120-2, and hookup regions 180-4 and 181-4.

As illustrated in FIG. 5, some of the word line drive signals from the driver 170 are supplied to the hookup region 180-4 via the fourth interconnects 194 provided on the hookup regions 181-4 and 180-4. Some of the word line drive signals from the driver 170 are supplied to the hookup region 180-3 via the fourth interconnects 194 provided on the hookup regions 181-4 and 180-4, bit line hookup circuit 120-2 and hookup region 180-3. Some of the word line drive signals from the driver 170 are supplied to the hookup region 180-2 via the fourth interconnects 194 provided on the hookup regions 181-4 and 180-4, bit line hookup circuit 120-2 and hookup regions 180-3 and 180-2. Some of the word line drive signals from the driver 170 are supplied to the hookup region 180-1 via the fourth interconnects 194 provided on the hookup regions 181-4 and 180-4, bit line hookup circuit 120-2, hookup regions 180-3 and 180-2, bit line hookup circuit 120-1 and hookup region 180-1.

By the provision of the paths for transmitting the signals and voltages as described above, the first interconnects 191, second interconnects 192, third interconnects 193 and fourth interconnects 194, which are not connected to the bit line hookup circuit 120-1, are provided in the region above the bit line hookup circuit 120-1. The first interconnects 191, second interconnects 192, third interconnects 193 and fourth interconnects 194 are located in the fourth metal layer as described above.

Similarly, the first interconnects 191, second interconnects 192, third interconnects 193 and fourth interconnects 194, which are not connected to the bit line hookup circuit 120-2, are provided in the region above the bit line hookup circuit 120-2. The first interconnects 191, second interconnects 192, third interconnects 193 and fourth interconnects 194 are located in the fourth metal layer as described above.

<1-2> Sense Amplifier and Bit Line Hookup Circuit

Figure 6:
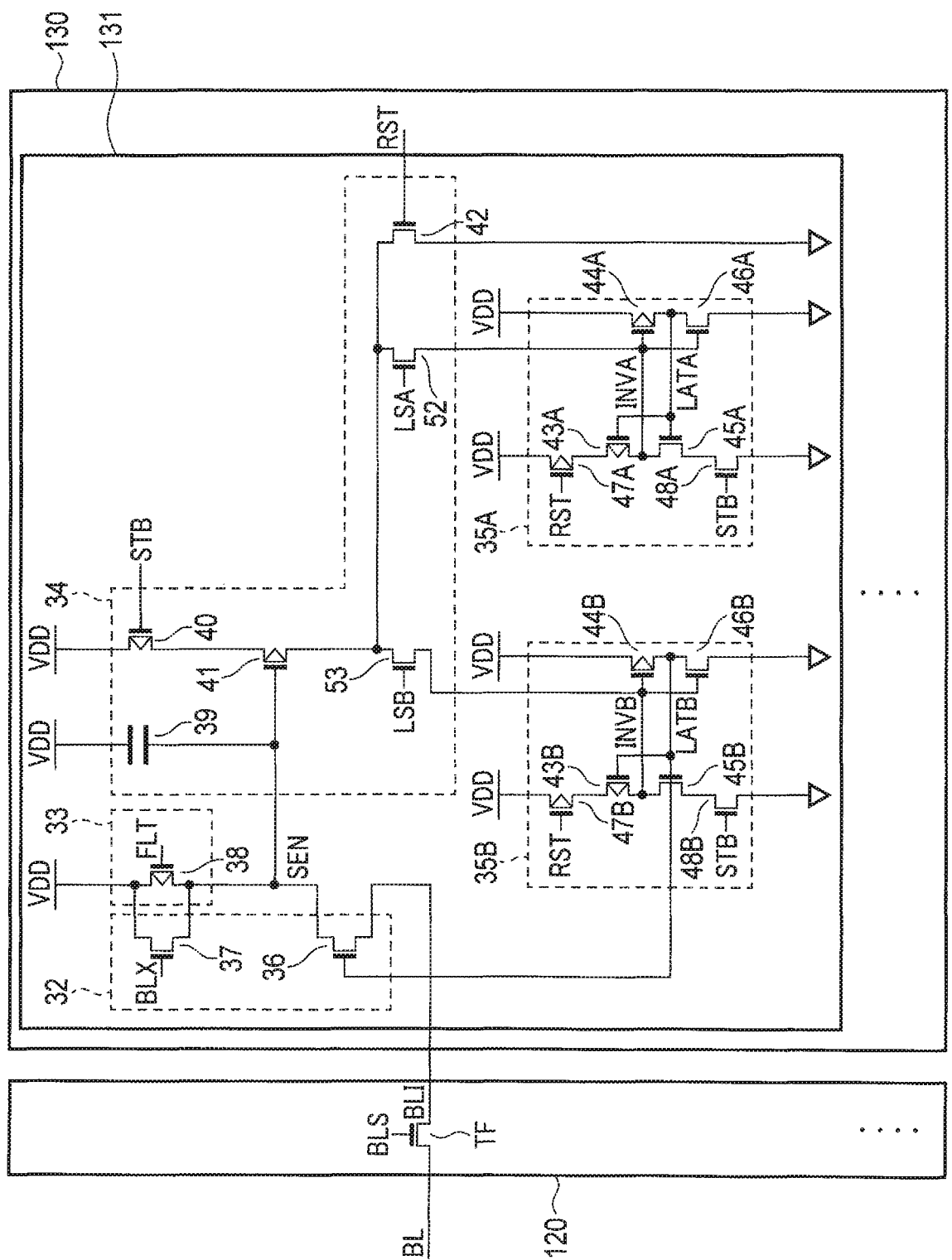
FIG. 6 is a circuit diagram illustrating a bit line hookup circuit and a sense amplifier of the semiconductor storage device according to the embodiment.

Referring to FIG. 6, the sense amplifier and bit line hookup circuit according to the present embodiment will now be described. As the sense amplifier 130 described here, a sense amplifier will be described by way of example, which determines data by sensing (current sense method) a current which reads page data (a page is composed of, for example, a plurality of memory cell transistors MT that are connected to an identical word line) by simultaneously driving all bit lines in the memory cell array 100.

The bit line hookup circuit 120 includes a plurality of transistors TF (transfer transistors). In the bit line hookup circuit 120, a bit line BL is connected to one end of a transistor TF. The transistor TF is, for example, high breakdown voltage transistor. The other end of the transistor TF is connected to one end of a transistor 36 in a sense module 131.

The sense amplifier 130 includes a plurality of sense modules 131. Transistors in each sense modules 131 are, for example, low breakdown voltage transistors. The plural sense modules 131 are connected to the bit lines BL via the transistors TF. The transistor TF controls a connection, based on a control signal BLS from the column controller 140a.

The sense module 131 is composed of a clamp circuit 32, a precharge circuit 33, a judgment circuit 34 and latch circuits 35A and 35B.

The clamp circuit 32 is composed of N-channel MOS transistors 36 and 37. The transistor 36 is controlled by a signal LATB, and the transistor 37 is controlled by a signal BLX. The precharge circuit 33 is composed of a P-channel MOS transistor 38. The transistor 38 is controlled by a signal FLT. The judgment circuit 34 is composed of P-channel MOS transistors 40 and 41, N-channel MOS transistors 42, 52 and 53 and a capacitor 39. The transistor 40 is controlled by a signal STB, and the transistor 41 is controlled by a signal SEN. In addition, the transistor 42 is controlled by a signal RST, the transistor 52 is controlled by a signal LSA, and the transistor 53 is controlled by a signal LSB.

The latch circuit 35A includes two inverters which are flip-flop-connected, namely P-channel MOS transistors 43A and 44A and N-channel MOS transistors 45A and 46A. A P-channel MOS transistor 47A and an N-channel MOS transistor 48A are used in order to activate/inactivate the latch circuit 35A. The transistor 43A is controlled by a signal LATA, and the transistor 44A is controlled by a signal INVA. The transistor 45A is controlled by the signal LATA, and the transistor 46A is controlled by the signal INVA. The transistor 47A is controlled by the signal RST, and the transistor 48A is controlled by the signal STB.

The potential of a sense node SEN is latched by the latch circuit 35A via the N-channel MOS transistor 52. The data latched by the latch circuit 35A is not used for a lockout operation for forcibly disconnecting the sense node SEN from the bit line.

The latch circuit 35B includes two inverters which are flip-flop-connected, namely P-channel MOS transistors 43B and 44B and N-channel MOS transistors 45B and 46B. A P-channel MOS transistor 47B and an N-channel MOS transistor 483 are used in order to activate/inactivate the latch circuit 35B. The transistor 43B is controlled by a signal LATB, and the transistor 44B is controlled by a signal INVB. The transistor 45B is controlled by the signal LATB, and the transistor 46B is controlled by the signal INVB. The transistor 47B is controlled by the signal RST, and the transistor 48B is controlled by the signal STB.

The potential of the sense node SEN is latched by the latch circuit 35B via the N-channel MOS transistor 53. The data latched by the latch circuit 35B is used for the lockout operation for forcibly disconnecting the sense node SEN from the bit line.

In the meantime, as the sense module 131, various configurations are applicable. For example, the configuration disclosed in U.S. patent application Ser. No. 12/563,296 filed Sep. 21, 2009 and entitled "NONVOLATILE SEMICONDUCTOR MEMORY" is applicable. The entire descriptions of this patent application are incorporated by reference herein.

In addition, as the sense module 131, various configurations are applicable. For example, the configuration disclosed in U.S. patent application Ser. No. 15/185,671 filed Jun. 17, 2016 and entitled "SEMICONDUCTOR MEMORY DEVICE" is applicable. The entire descriptions of this patent application are incorporated by reference herein.

<1-3> Interconnect Layer, and Interconnects of Bit Line Hookup Circuit

Referring to FIGS. 7 to 9, the first interconnects 191, second interconnects 192, third interconnects 193, fourth interconnects 194 and bit line hookup circuit 120 will now be described in detail. Hereinafter, in some cases, a set of the first interconnects 191, second interconnects 192, third interconnects 193 and fourth interconnects 194 is referred to as "interconnects 190". The description of the interconnects 190 is also applicable to each of the first interconnects 191, second interconnects 192, third interconnects 193 and fourth interconnects 194.

FIG. 7 schematically illustrates connections between the interconnects 190 and the components of the NAND-type flash memory 1, and also illustrates the positional relationship between the interconnects 190 and bit lines BL. In FIG. 7, the components in the NAND-type flash memory 1 are depicted as schematic blocks.

The bit line hookup region 120 includes a plurality of transistors TF.

Each bit line BL is connected to the memory cell array 100 and one end of the transistor TF. The other end of the transistor TF is connected to the transistor in the sense amplifier 130. The bit lines BL are realized by interconnects 121, and the interconnects 121 are located in, for example, the third metal layer. An interconnect 121 is connected to a diffusion layer corresponding to the source or drain of the transistor TF provided on the semiconductor substrate 10 by a contact (not shown) and another interconnect (not shown).

As described above, the first interconnects 191, in at least a portion thereof, traverse the bit line hookup circuit 120, and connect the column controller 140a and sense amplifier 130. The second interconnects 192, in at least a portion thereof, traverse the bit line hookup circuit 120, and connect the column controller 140a and hookup circuits 181-1 to 181-4. The third interconnects 193, in at least portions thereof, traverse the bit line hookup circuit 120, and connect the voltage generator 160 and peripheral circuit 140 and connect the voltage generator 160 and driver 170. The fourth interconnects 194, in at least a portion thereof, traverse the bit line hookup circuit 120, and connect the hookup circuits 180-1 to 180-4 and driver 170.

Hereinafter, that portion of each of the interconnects 190 (i.e. first interconnects 191, second interconnects 192, third interconnects 193 and fourth interconnects 194), which traverses the bit line hookup circuit 120, is referred to as "a first portion 200". Specifically, each of the first interconnects 191, second interconnects 192, third interconnects 193 and fourth interconnects 194 includes its own first portion 200.

The structure of the interconnects 121 and interconnects (first portions) 200 is as illustrated in FIGS. 8 and 9. FIG. 8 illustrates a part of the structure of the bit line hookup region 120 along the D1 direction and D2 direction. FIG. 9 illustrates the structure of the bit line hookup region 120 along the D1 direction and D3 direction, and illustrates the structure along line A-A in FIG. 8. In order to make easily understandable the features of the interconnects 190 in the bit line hookup circuit 120, FIG. 8 does not illustrate components other than the first portions 200 of interconnects 190 and the interconnects 121.

As illustrated in FIGS. 8 and 9, in the bit line hookup circuit 120, a plurality of interconnects 121 are provided. The interconnects 121 are provided above, in the D3 direction, region of the semiconductor substrate 10 and in an insulator 122, and are located in the third metal layer. The plural interconnects 121 extend in parallel to each other, for example, along the D2 direction, and are provided at intervals of a length S5.

In the bit line hookup circuit 120, the first portions 200 of the interconnects 190 are provided on the insulator 122 and in a region above, in the D3 direction, the interconnects 121, and are located in the fourth metal layer. The plural interconnects 190 (the first portions 200 of the interconnects 190) extend in parallel to each other, for example, along the D1 direction, and are provided intervals of a length S6 (S5<S6). In other words, the interconnects 190 include portions which extend in parallel over a predetermined section, and such portions are located, for example, on the bit line hookup circuit 120, and are the first portions 200.

As described above, the interconnects 121 are located in the third metal layer, and the interconnects 190 are located in the fourth metal layer. Thus, as is understood from FIG. 8, when the bit line hookup circuit 120 is seen from above (from above the semiconductor substrate 10), the plural interconnects 121 and plural interconnects 190 intersect.

As described above, the interconnects 190 extend in the D1 direction in the bit line hookup circuit 120, or in other words, the first portions 200 of the interconnects 190 extend in the D1 direction. In contrast, some of the interconnects 190 extend also in the D2 direction in the hookup regions 180-1, 180-2, 180-3, 180-4, 181-1, 181-2, 181-3 and 181-4. Besides, some of the interconnects 190 (e.g. first interconnects 191, second interconnects 192, third interconnects 193) may include bent portions in the hookup regions 180 (see FIG. 3 and FIG. 4).

The bit line hookup circuit 120 is provided with contact plugs (not shown) which connect the interconnect 121 of the third metal layer, which function as the bit lines BL, to the second metal layer.

An insulator 123 is provided on the interconnects 190 (first portions 200). In addition, an interconnect layer 124 may be provided on the insulator 123. However, interconnects provided on or above the insulator 123 have different functions from the first to fourth metal layers and belong to different types from the first to fourth metal layers. Specifically, the interconnects located in the first to fourth metal layers, which include the interconnects 190, interconnect the components in the inside of the NAND-type flash memory 1. In contrast, the interconnect layer 124 includes, for example, re-distribution layers. Unlike the interconnects located in the first to fourth metal layers, each re-distribution layer is, at least at one end thereof, connected to a component outside the NAND-type flash memory 1. Specifically, the re-distribution layer connects, for example, a pad included in the input/output terminal 150 and a printed wiring board on which the NAND-type flash memory 1 is provided. Accordingly, in the present embodiment, unlike the first to fourth metal layers, the interconnect layer 124 including the re-distribution layers is not treated as an interconnect layer. Specifically, even if the re-distribution layer 124 is provided above the fourth metal layer, the interconnect layer located at the highest position among the interconnect layers of the NAND-type flash memory 1 is the fourth metal layer. In addition, the interconnects 190 are interconnects which are located in the fourth metal layer and are thus located at the highest position.

When the interconnect layer 124 is provided, an insulator 125 is provided on the interconnect layer 124.

Interconnects that are connected to the bit line hookup circuit 120 may be provided in the fourth metal layer of the bit line hookup circuit 120.

<1-4> Advantageous Effects

According to the above-described embodiment, the interconnects (first interconnects 191 and second interconnects 192) for first and second column control signals, the interconnects (third interconnects 193) for transferring voltages which are supplied from the voltage generator 160 to the peripheral circuit 140 and driver 170, and the interconnects (fourth interconnects 194) for the word line drive signals which are supplied from the driver 170 to the hook up region 180, are provided in the upper region in the D3 direction of the bit line hookup circuit 120. Thereby, the circuit area of the NAND-type flash memory 1 can be reduced.

Hereinafter, a comparative example will be described in order to make easier the understanding of the advantageous effects of the above-described embodiment.

In the comparative example, a description is given of the case in which the interconnects for transmitting the first and second column control signals, the interconnects for transmitting voltages which are supplied from the voltage generator 160 and the interconnects for transmitting the word line drive signals from the driver 170 are provided in a peripheral circuit 140b.

Figure 10:
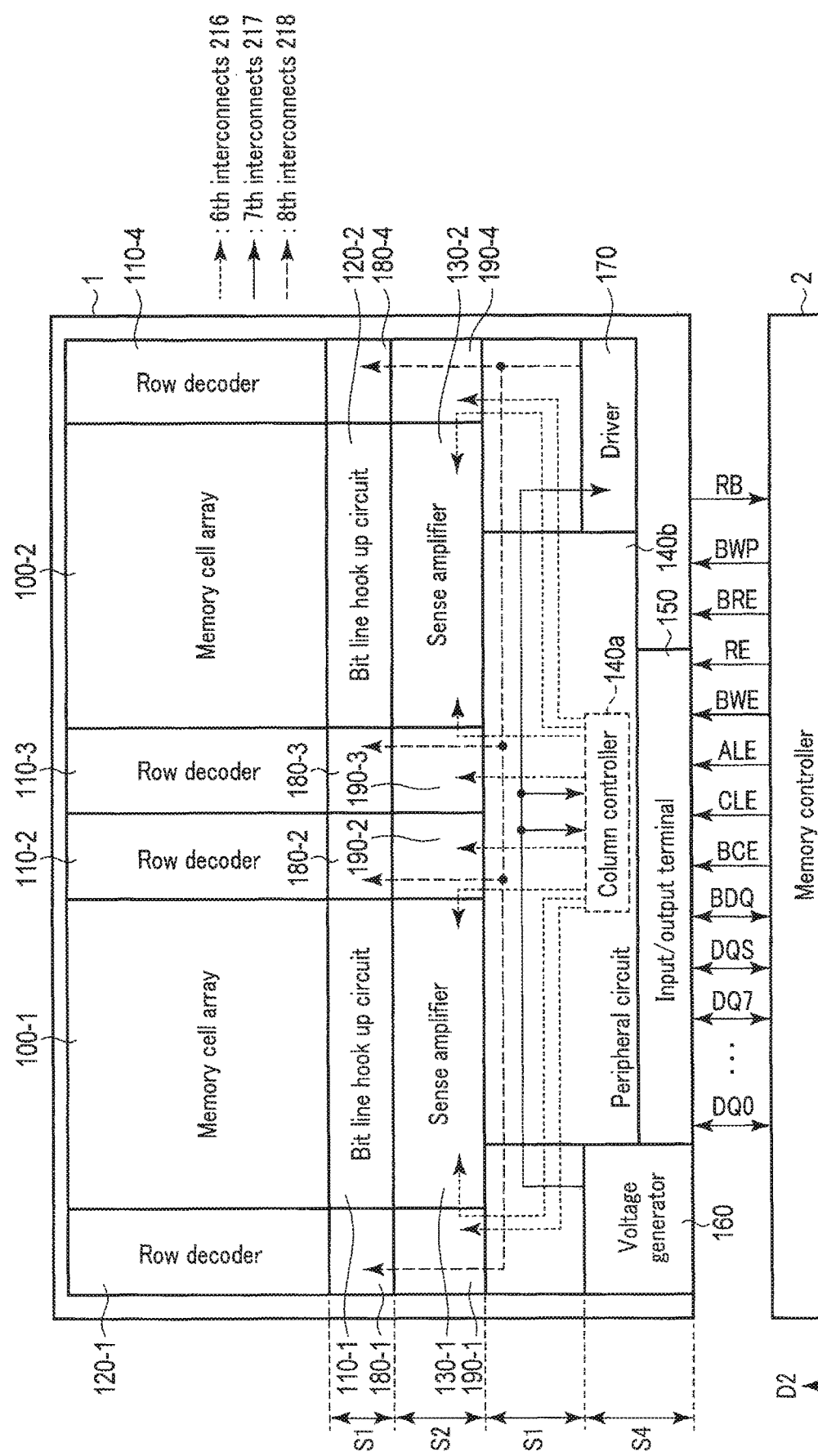
FIG. 10 is a layout view illustrating a semiconductor storage device according to a comparative example of the embodiment.

Sixth interconnects 216 for transmitting the first and second column control signals, seventh interconnects 217 for transmitting the voltages from the voltage generator 160 and eighth interconnects 218 for transmitting the word line drive signals from the driver 170 are provided in the fourth metal layer. The sixth interconnects 216, seventh interconnects 217 and eighth interconnects 218 need to be disposed in the peripheral circuit 140b such that the sixth interconnects 216, seventh interconnects 217 and eighth interconnects 218 reach the destinations of transmission of signals and voltages. As a result, the peripheral circuit 140b needs to have such a space as to make it possible to dispose the sixth interconnects 216, seventh interconnects 217 and eighth interconnects 218 in the fourth metal layer. Thus, as illustrated in FIG. 10, the length in the D2 direction of the peripheral circuit 140b needs to be increased by, for example, length S1.

In this case, the length in the D2 direction of the NAND-type flash memory 1 according to the comparative example is greater by the length S1 than the length in the D2 direction of the above-described NAND-type flash memory 1. In this manner, the decrease in length in the D2 direction of the peripheral circuit 140b is limited because the arrangement of the sixth interconnects 216, seventh interconnects 217 and eighth interconnects 218 becomes a bottleneck.

In the embodiment, the first interconnects 191 and second interconnects 192 for transmitting the first and second column control signals, the third interconnects 193 for transmitting the voltages from the voltage generator 160 and the fourth interconnects 194 for transmitting the word line drive signals are provided on the bit line hookup circuit 120 in which the ratio of occupation of the interconnects in the D1-D2 plane in the fourth metal layer is originally small. It is thus possible to prevent the circuit area of the NAND-type flash memory 1 from increasing like the NAND-type flash memory 1 of the comparative example.

<2> Modification 1

Modification 1 will be described.

In Modification 1, only the different parts from the above-described embodiment will be described with reference to FIG. 11. Modification 1 differs from the above-described embodiment with respect to the third interconnects 193.

Figure 11:
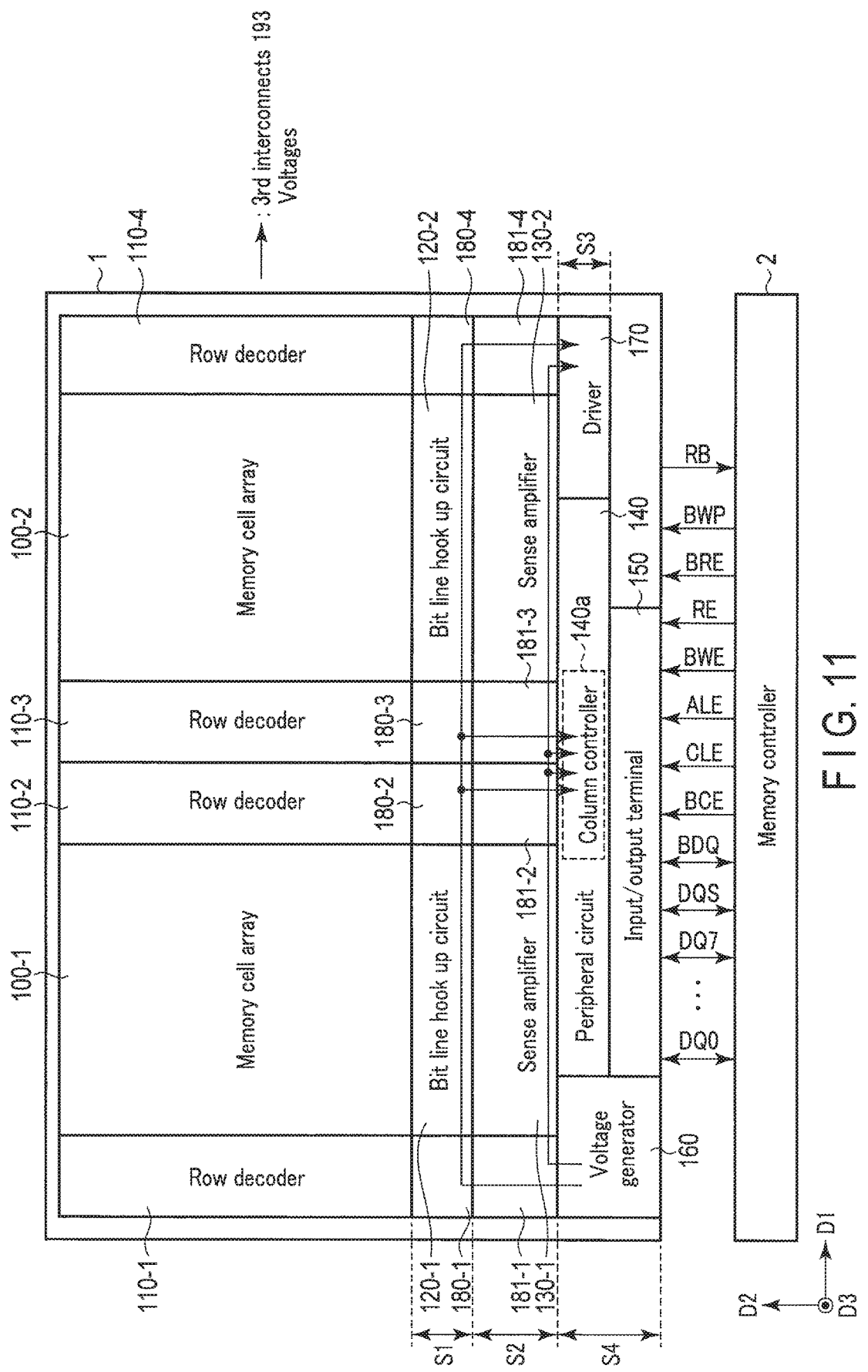
FIGS. 11 and 12 are layout views illustrating semiconductor storage devices according to modifications.

As illustrated in FIG. 11, a part of some of the third interconnects 193 are located in the fourth metal layer on the sense amplifier 130. Specifically, some of the voltages from the voltage generator 160 are supplied to the peripheral circuit 140 via the third interconnects 193 provided on the sense amplifier 130-1 and hookup region 181-2. Some of the voltages from the voltage generator 160 are supplied to the peripheral circuit 140 via the third interconnects 193 provided on the sense amplifier 130-1 and hookup regions 181-2 and 181-3. Some of the voltages from the voltage generator 160 are supplied to the driver 170 via the third interconnects 193 provided on the sense amplifier 130-1, hookup regions 181-2 and 181-3, sense amplifier 130-2 and hookup region 181-4.

<3> Modification 2

Modification 2 will be described.

In Modification 2, only the different parts from the above-described embodiment will be described with reference to FIG. 12. Modification 2 differs from the above-described embodiment with respect to the fourth interconnects 194.

Figure 12:
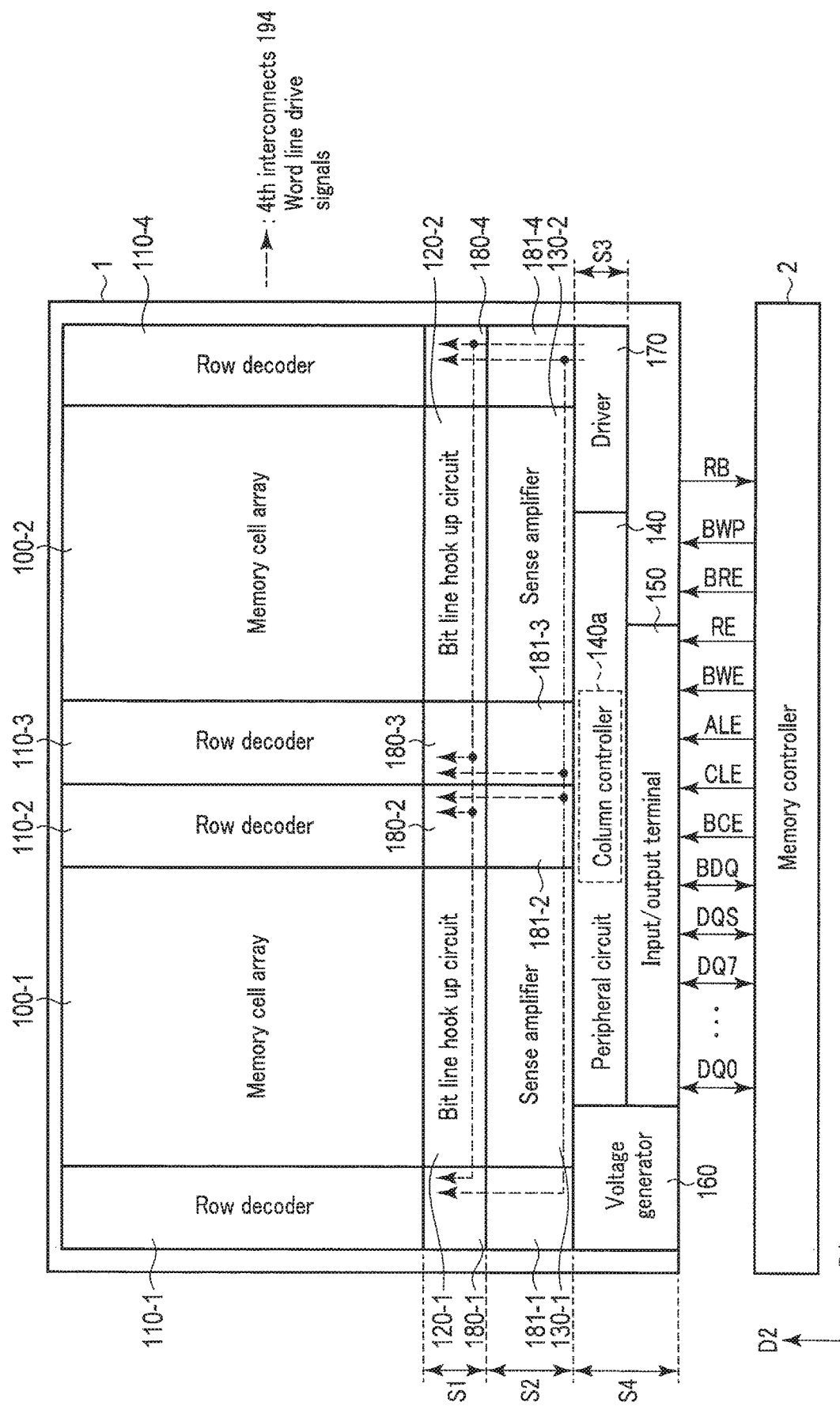

As illustrated in FIG. 12, a part of some of the fourth interconnects 194 are located in the fourth metal layer on the sense amplifier 130. Specifically, some of the word line drive signals from the driver 170 are supplied to the hookup region 180-3 via the fourth interconnects 194 provided on the hookup region 181-4, sense amplifier 130-2 and hookup regions 181-3 and 180-3. Some of the word line drive signals from the driver 170 are supplied to the hookup region 180-2 via the fourth interconnects 194 provided on the hookup region 181-4, sense amplifier 130-2 and hookup regions 181-3, 181-2 and 180-2. Some of the word line drive signals from the driver 170 are supplied to the hookup region 180-1 via the fourth interconnects 194 provided on the hookup region 181-4, sense amplifier 130-2, hookup regions 181-3 and 181-2, sense amplifier 130-1 and hookup regions 181-1 and 180-1.

<4> Others

The above-described Modifications 1 and 2 may be combined.

In addition, in the above-described embodiment, although the bit line hookup circuit 120 and sense amplifier 130 were described as different structural elements, the bit line hookup circuit 120 and sense amplifier 130 may be configured as a single component.

Besides, in the above-described embodiment, the case was described in which the planar memory is applied as the memory cell array 100. However, even when a three-dimensional stacked memory is applied as the memory cell array 100, the same advantageous effects as in the above-described embodiment can be obtained.

The layout of the components of the NAND-type flash memory 1, which extends in the D1 and D2 directions, is not limited to the above-described example. In this embodiment, arbitrary layouts are applicable. For example, the arrangement of the peripheral circuit 140 and sense amplifiers 130 may be different from the arrangement shown in FIG. 3, etc. as long as the interconnects that are not connected to the bit line hookup circuit 120 are arranged above the bit line hookup region 120. To be more specific, the position of the column controller 140a may differ from the position in FIG. 3, etc., and the position of the voltage generator 160 and/or driver 170 may differ from the position in FIG. 3, etc.

The configuration of the memory cell array 100 is disclosed in U.S. patent application Ser. No. 12/407,403 filed 19 Mar. 2009 and entitled "three dimensional stacked nonvolatile semiconductor memory". In addition, the configuration thereof is disclosed in U.S. patent application Ser. No. 12/406,524 filed 18 Mar. 2009 and entitled "three dimensional stacked nonvolatile semiconductor memory", in U.S. patent application Ser. No. 13/816,799 filed 22 Sep. 2011 and entitled "nonvolatile semiconductor memory device", and in U.S. patent application Ser. No. 12/532,030 filed 23 Mar. 2009 and entitled "semiconductor memory and method for manufacturing the same". The entire descriptions of these patent applications are incorporated by reference herein.

In addition, in each embodiment of the present invention, (1) in the read operation, the voltage applied to a word line selected in the read operation of A level is, for example, 0 V to 0.55 V. However, the voltage is not limited to this and may be 0.1 V to 0.24 V, 0.21 V to 0.31 V, 0.31 V to 0.4 V, 0.4 V to 0.5 V, or 0.5 V to 0.55 V.

The voltage applied to a word line selected in the read operation of B level is, for example, 1.5 V to 2.3 V. However, the voltage is not limited to this and may be 1.65 V to 1.8 V, 1.8 V to 1.95 V, 1.95 V to 2.1 V, or 2.1 V to 2.3 V.

The voltage applied to a word line selected in the read operation of C level is, for example, 3.0 V to 4.0 V. However, the voltage is not limited to this and may be 3.0 V to 3.2 V, 3.2 V to 3.4 V, 3.4 V to 3.5 V, 3.5 V to 3.6 V, or 3.6 V to 4.0 V.

The time (tR) of the read operation can be, for example, 25 μs to 38 μs, 38 μs to 70 μs, or 70 μs to 80 μs.

(2) The write operation includes a program operation and a verify operation, as described above. In the write operation, the voltage first applied to a word line selected at the time of program operation is, for example, 13.7 V to 14.3 V. However, the voltage is not limited to this and may be, for example, 13.7 V to 14.0 V, or 14.0 V to 14.6 V.

The voltage first applied to a selected word line when writing to an odd-numbered word line and the voltage first applied to a selected word line when writing to an even-numbered word line may be different.

When the program operation is performed by the ISPP method (Incremental. Step Pulse Program), the step-up voltage is, for example, 0.5 V.

The voltage applied to a non-selected word line can be, for example, 6.0 V to 7.3 V. However, the voltage is not limited to this and may be, for example, 7.3 V to 8.4 V, or 6.0 V or less.

The pass voltage to be applied may be changed depending on whether the non-selected word line is an odd-numbered word line or an even-numbered word line.

The time (tProg) of the write operation can be, for example, 1700 μs to 1800 μs, 1800 μs to 1900 μs, or 1900 μs to 2000 μs.

(3) In the erase operation, the voltage first applied to a well formed in the upper portion of a semiconductor substrate and having the memory cell arranged above is, for example, 12 V to 13.6 V. However, the voltage is not limited to this and may be, for example, 13.6 V to 14.8 V, 14.8 V to 19.0 V, 19.0 V to 19.8 V, or 19.8 V to 21 V.

The time (tErase) of the erase operation can be, for example, 3000 μs to 4000 μs, 4000 μs to 5000 μs, or 4000 μs to 9000 μs.

(4) The configuration of the memory cell includes:

a charge accumulation layer arranged on a 4 to 10 nm thick tunnel insulating film on a semiconductor substrate (silicon substrate). The charge accumulation layer can have a stacked structure including a 2 to 3 nm thick insulating film made of, e.g. SiN or SiON, and a 3 to 8 nm thick polysilicon film. A metal such as Ru may be added to polysilicon. An insulating film is formed on the charge accumulation layer. This insulating film includes, for example, a 4 to 10 nm thick silicon oxide film sandwiched between a 3 to 10 nm thick lower high-k film and a 3 to 10 nm thick upper high-k film. The high-k films are made of, for example, HfO. The silicon oxide film can be thicker than the high-k films. A 30 nm to 70 nm thick control electrode is formed on a 3 to 10 nm thick material on the insulating film. A material used to adjust the work. function is a metal oxide film such as TaO or a metal nitride film such as TaN. W or the like can be used for the control electrode.

An air gap can be formed between the memory cells.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a semiconductor substrate extending in a first direction and a second direction crossing the first direction;
a memory cell array formed above the semiconductor substrate in a third direction crossing both the first direction and the second direction, the memory cell array including a plurality of bit lines extending in the first direction, and the plurality of bit lines being provided at a first level in the third direction;
a sense amplifier formed on the semiconductor substrate and including a plurality of sense amplifier modules;
a first circuit formed on the semiconductor substrate and including a plurality of transistors, each of the transistors being connected between one of the plurality of bit lines and one of the plurality of sense amplifier modules; and
a plurality of interconnects extending in the second direction in the first circuit, the plurality of interconnects being provided at a second level in the third direction, the second level being higher than the first level, and the plurality of interconnects not being connected to the first circuit,
wherein:
the plurality of interconnects are provided at a highest position in the third direction among interconnects which electrically connect two components in the semiconductor storage device, and
the plurality of bit lines extend in the first direction in the first circuit, and the plurality of interconnects extend in the second direction in the first circuit.

2. The semiconductor storage device of claim 1, wherein the plurality of interconnects include a first interconnect which transmits a first signal which is supplied to the sense amplifier.

3. The semiconductor storage device of claim 2, further comprising a controller configured to output the first signal.

4. The semiconductor storage device of claim 1, further comprising a voltage generator,
wherein the plurality of interconnects include a first interconnect which transmits a voltage which is output from the voltage generator.

5. The semiconductor storage device of claim 4, further comprising a driver configured to transfer the voltage which is output from the voltage generator via the first interconnect,
wherein the plurality of interconnects include a second interconnect which transmits a signal which is output from the driver.

6. The semiconductor storage device of claim 1, wherein the sense amplifier, the first circuit, and the memory array are arranged along the first direction.

7. The semiconductor storage device of claim 1, wherein the plurality of interconnects extend across the plurality of bit lines in the first circuit.

8. The semiconductor storage device of claim 1, wherein:
the plurality of bit lines include a first bit line at one end of the plurality of bit lines and a second bit line at another end of the plurality of bit lines, and
the plurality of interconnects extend between a position above the first bit line and a position above the second bit line in the first circuit.

9. A semiconductor storage device comprising:
a memory cell array including a plurality of bit lines;
a sense amplifier including a plurality of sense amplifier modules, each of the plurality of sense amplifier modules being coupled to one of the plurality of bit lines through a transistor;
a voltage generator;
a driver; and
a plurality of interconnects which are provided at a position higher than the bit lines in the sense amplifier and which are not connected to the sense amplifier, wherein:
the plurality of interconnects are provided at a highest position among interconnects which electrically connect two components in the semiconductor storage device,
the plurality of interconnects include at least one of a first interconnect which transfers to the driver a voltage which is output from the voltage generator, and a second interconnect which transmits a signal which is output from the driver,
the plurality of bit lines extend in a first direction in the sense amplifier, and the plurality of interconnects extend in a second direction in the sense amplifier, and
the second direction crosses the first direction.

10. The semiconductor storage device of claim 9, wherein:
the voltage generator and the driver are arranged along the second direction,
the voltage generator is located at a first side of the sense amplifier, and
the driver is located at a second side of the sense amplifier.

11. The semiconductor storage device of claim 9, wherein the plurality of interconnects extend across the plurality of bit lines in the sense amplifier.

12. The semiconductor storage device of claim 9, wherein:
the plurality of bit lines include a first bit line at one end of the plurality of bit lines and a second bit line at another end of the plurality of bit lines, and
the plurality of interconnects extend between a position above the first bit line and a position above the second bit line in the sense amplifier.

13. The semiconductor storage device of claim 9, further comprising a semiconductor substrate extending in the first direction and the second direction,
wherein:
the memory cell array is formed above the semiconductor substrate in a third direction crossing both the first direction and the second direction,
the sense amplifier, the voltage generator, and the driver are formed on the semiconductor substrate, and
the plurality of bit lines are provided at a first level in the third direction, and the at least one of the first interconnect and the second interconnect is provided at a second level in the third direction, the second level being higher than the first level.

* * * * *